US008871649B2

(12) United States Patent
Jang et al.

(10) Patent No.: US 8,871,649 B2
(45) Date of Patent: Oct. 28, 2014

(54) METHODS OF FORMING TRENCH/HOLE TYPE FEATURES IN A LAYER OF MATERIAL OF AN INTEGRATED CIRCUIT PRODUCT

(71) Applicants: GLOBAL FOUNDRIES Inc., Grand Cayman (KY); Renesas Electronics Corporation, Kanagawa (JP); International Business Machines Corporation, Armonk, NY (US)

(72) Inventors: Linus Jang, Clifton Park, NY (US); Yoshinori Matsui, Albany, NY (US); Chiahsun Tseng, Wynanyskill, NY (US)

(73) Assignees: GLOBALFOUNDRIES Inc., Grand Cayman (KY); Renesas Electronics Corporation, Kanagawa (JP); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/834,946

(22) Filed: Mar. 15, 2013

(65) Prior Publication Data
US 2014/0273443 A1     Sep. 18, 2014

(51) Int. Cl.
*H01L 21/311*      (2006.01)
*H01L 21/768*      (2006.01)

(52) U.S. Cl.
CPC ................................. *H01L 21/76804* (2013.01)
USPC .... 438/700; 438/680; 438/733; 257/E21.006; 257/E21.023; 257/E21.17; 257/E21.22; 257/E21.267; 257/E21.278; 257/E21.304; 257/E21.327; 257/E21.347; 257/E21.545; 257/E21.547; 257/E21.577; 257/E21.585

(58) Field of Classification Search
USPC ......... 438/700, 270, 197, 199, 667, 672, 680, 438/687, 692, 733, 756, 787, 788, 798; 257/E21.006, E21.023, E21.17, 257/E21.22, E21.267, E21.278, E21.304, 257/E21.327, E21.347, E21.547, E21.545, 257/E21.577, E21.585
See application file for complete search history.

(56) References Cited

U.S. PATENT DOCUMENTS

| 5,741,741 | A  | * | 4/1998  | Tseng ............................. 438/637 |
| 6,127,098 | A  | * | 10/2000 | Nakagawa et al. ............ 430/315 |
| 6,265,306 | B1 | * | 7/2001  | Starnes et al. ................. 438/632 |
| 6,946,377 | B2 | * | 9/2005  | Chambers ....................... 438/588 |
| 7,711,220 | B2 | * | 5/2010  | Scofet et al. ..................... 385/29 |
| 8,083,962 | B2 | * | 12/2011 | Lee et al. .......................... 216/66 |

* cited by examiner

*Primary Examiner* — David Nhu
(74) *Attorney, Agent, or Firm* — Amerson Law Firm, PLLC

(57) ABSTRACT

One illustrative method disclosed herein involves forming a layer of insulating material, forming a patterned layer of photoresist above the layer of insulating material, wherein the patterned layer of photoresist has an opening defined therein, forming an internal spacer within the opening in the patterned layer of photoresist, wherein the spacer defines a reduced-size opening, performing an etching process through the reduced-size opening on the layer of insulating material to define a trench/hole type feature in the layer of insulating material, and forming a conductive structure in the trench/hole type feature in the layer of insulating material.

20 Claims, 13 Drawing Sheets

= (1) As-Drawn Target for Trench/Hole

= (2) Post – Lithography Trench/Hole

= (3) Trench/Hole - Post Litho Conformal Shrink

= (4) Trench/Hole - Post – Etch (Positive Bias)

METHODS OF FORMING TRENCH/HOLE TYPE FEATURES IN A LAYER OF MATERIAL OF AN INTEGRATED CIRCUIT PRODUCT

BACKGROUND OF THE INVENTION

1. Field of the Invention

Generally, the present disclosure relates to the manufacture of sophisticated semiconductor devices, and, more specifically, to various novel methods of forming trench/hole type features in a layer of material of an integrated circuit product.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Metal oxide field effect transistors (MOSFETs or FETs) represent one important type of circuit element that substantially determines performance of the integrated circuits. A FET (whether an NFET or a PFET) is a device that typically includes a source region, a drain region, a channel region that separates the source region and the drain region, and a gate electrode positioned above the channel region. A gate insulation layer is positioned between the gate electrode and the channel region that will be formed in the substrate. Electrical contacts are made to the source and drain regions, and current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region. Traditionally, FETs have been substantially planar devices, but similar principles of operation apply to more three-dimensional FET structures, devices that are typically referred to as FinFETs.

A typical integrated circuit product also includes many levels, e.g., 7-10, of so-called metallization layers that constitute the electrical "wiring" that provides a means to electrically connect to the integrated circuits formed in the semi-conducting substrate. The metallization layers comprise layers of insulating materials having various conductive structures, e.g., conductive lines and vias, formed therein. Typically, the conductive vias provide electrical connection between an underlying conductive line in an underlying metallization layer and an overlying conductive line in an overlying metallization layer. In current-day, high performance integrated circuit products, the conductive lines and vias are typically formed using single-damascene or dual-damascene techniques, although such conductive structures may sometimes be formed using traditional deposition/photolithography/patterning techniques. Thus, improving the functionality and performance capability of various metallization systems has become important in designing modern semiconductor devices. One example of such improvements is the enhanced use of copper metallization systems in integrated circuit devices and the use of so-called "low-k" or ULK dielectric materials (for example, materials having a dielectric constant less than 3) in such devices. Copper metallization systems exhibit improved electrical conductivity as compared to, for example, prior art metallization systems using aluminum for the conductive lines and vias. The use of low-k dielectric materials also tends to improve the signal-to-noise ratio (S/N ratio) by reducing crosstalk as compared to other dielectric materials with higher dielectric constants.

As noted above, in modern ultra-high density integrated circuits, device features have been steadily decreased in size to enhance the performance of the semiconductor device and the overall functionality of the circuit. However, such reductions in the size of the device features, and the associated increase in packing density, mandates that other aspects of the integrated circuit product must also be reduced in size. This means that, among other things, the various conductive lines and vias in the metallization layers of an integrated circuit product must be compressed into ever-decreasing plot space and that the physical size of the conductive lines and vias must also be reduced. In turn, this increased overall "crowding" of the various conductive lines and vias means that device designers have had to become very creative in terms of minimizing the physical size of such conductive lines and vias and in providing means to insure proper alignment between adjacent levels of such conductive structures when alignment tolerances or "process windows" are very small.

In many cases, formation of a conductive line or via in a layer of insulating material involves forming a trench-type or hole-type feature, respectively, in a layer of insulating material. At a high level, the process of forming a conductive line/via generally involves depositing a layer of insulating material, forming a patterned etch mask comprised of a photoresist material above the layer of insulating material, performing an etching process through the etch mask to define the trench/hole type feature in the layer of insulating material, removing the patterned etch mask, overfilling the trench/hole type feature with a conductive material, such as copper, and removing excess portions of the conductive material positioned outside of the trench/hole type feature by performing a chemical mechanical planarization (CMP) process. Such processes are well known to those skilled in the art.

By way of background, photolithography tools and systems typically include a source of radiation at a desired wavelength, an optical system and, typically, the use of a so-called mask or reticle that contains a pattern that is desired to be formed on a wafer. Radiation is provided through or reflected off the mask or reticle to form an image on a light-sensitive layer of photoresist material that is formed above a semiconductor wafer. The radiation used in such systems may be light, such as ultraviolet light, deep ultraviolet light (DUV), vacuum ultraviolet light (VUV), extreme ultraviolet light (EUV), etc. The radiation may also be x-ray radiation, e-beam radiation, etc. Ultimately, after so-called photoresist development, a patterned photoresist mask layer is formed that may be used for a variety of purposes, e.g., as an etch mask to form trench/hole type features in an underlying layer of insulating material. Currently, most of the photolithography systems employed in semiconductor manufacturing operations are so-called deep ultraviolet systems (DUV) that generate radiation at a wavelength of 248 nm or 193 nm. However, the capabilities and limits of traditional DUV photolithography systems are being tested as device dimensions continue to shrink. A typical photolithography process generally involves the steps of: (1) applying a layer of photoresist above a wafer or substrate, typically accomplished by a spin-coating process; (2) pre-baking (or soft-baking) the layer of photoresist at a temperature of approximately 90-120° C. to reduce the level of solvents in the layer of photoresist and to improve the adhesion characteristics of the photoresist; (3) performing an exposure process, wherein a pattern on a reticle is projected onto the layer of photoresist used in a stepper tool to create a latent image in the layer of photoresist; (4) performing a post-exposure bake on the layer of photoresist at a temperature approximately 5-15° C. higher than the pre-bake process; (5) performing a develop process to turn the latent image in the layer of photoresist into the final resist image; and (6) performing a post-bake process (or hard-bake) at a temperature of approximately 125-160° C. to remove residual solids and to improve adhesion of the patterned photoresist mask. These process steps result in a "post-litho" patterned etch mask. The above processes are well known to those skilled in the art and, thus, will not be described herein in any greater detail.

As it relates to actually forming a trench/hole type feature in a layer of insulating material, the trench/hole type feature has a target critical dimension (CD) or width that the process engineer tries to achieve based on the design criteria and rules for the particular product under design. Historically, when trench/hole type features were larger in size, they were formed in a layer of insulating material by forming a post-litho etch mask that had openings that corresponded to the trench/hole type features that were to be directly etched into the underlying layer of insulating material. This was typically accomplished by using a dark-tone reticle (a "dark-field" mask) with a clear-field opening (that corresponds to the trench/hole type feature) to expose the layer of photoresist and using a so-called positive tone developer (PTD) that removed the exposed photoresist material. Thereafter, a positive etch bias etch process was performed to define the trench/hole type feature in the underlying layer of material, wherein the feature exhibited substantially vertical sidewalls. A positive etch bias etch process is one whereby the etched feature has a larger dimension than that of the corresponding feature defined in the patterned layer of photoresist. For example, a square opening in a patterned layer of photoresist may have a critical dimension of 40 nm. When a positive etch bias etch process is performed through the photoresist mask to form, for example, a contact opening in an underlying layer of material, the contact opening will have a larger critical dimension, e.g., 50 nm, than that of the opening in the patterned layer of photoresist.

However, as dimensions continued to shrink, the aforementioned PTD/positive etch bias etch process technique proved to be inadequate to produce the very small conductive lines and vias required on modern integrated circuit products. Thus, the industry evolved to using a so-called negative tone developer (NTD) process coupled with a negative etch bias etching process to produce the required smaller features. In general, this process involves forming a patterned layer of photoresist where the post-litho openings are as close as possible to the final desired target dimension for the feature. This required pushing the photolithography equipment to its limits to produce a patterned layer of photoresist with such very small sized post-litho openings. The NTD process involved use of a clear-tone reticle (a "clear-field" mask) with a dark-field line that corresponds to the trench/hole type feature to expose the layer of photoresist. Using an NTD, the exposed photoresist material is left in place while the non-exposed material is removed. Thereafter, a negative etch bias etch process was performed to define the trench/hole type feature in the underlying layer of material, wherein the feature exhibited inwardly tapered sidewalls. A negative etch bias etch process is one whereby the etched feature has a smaller dimension than that of the corresponding feature defined in the patterned layer of photoresist. For example, a square opening in a patterned layer of photoresist may have a critical dimension of 40 nm. When a negative etch bias etch process is performed through the photoresist mask to form, for example, a contact opening in an underlying layer of material, the contact opening will have a smaller critical dimension, e.g., 30 nm, than that of the opening in the patterned layer of photoresist. Simply put, the negative etch bias process was performed as a means to effectively reduce the critical dimension of the resulting conductive line/via beyond what could be directly patterned using the previous PTD/positive etch bias processing techniques described above.

FIG. 1 depicts a prior art formation process for two illustrative trench/hole type features 10A/10B and will be referenced to further explain some of the problems associated with existing prior art methodologies. FIG. 1 depicts the features at three points during the fabrication process: (1) as-drawn target during the design process; (2) the post-lithography condition after a patterned photoresist mask has been formed based upon the as-drawn target; and (3) the post-etch condition. The upper portion of FIG. 1 depicts the tip-to-tip spacing between the features, whereas the lower portion of FIG. 1 depicts the tip-to-side spacing between the features. As indicated in FIG. 1, the dimensions of the feature changes during the course of the lithography and etching processes and the spacing between the features changes accordingly.

As shown in FIG. 1, the features have a target length 12T, a post-litho length 12PL and a post-etch length 12PE, wherein the post-litho length 12PL is greater than the target length 12T, and the post-etch length 12PE is less than the target length 12T. Similarly, the features have a target width 14T, and a post-litho width 14PL that is greater than the target width 14T. In the depicted example, the post-etch width 14PE is equal to the target width 14T. The target dimensions of the features are drawn as precisely as the photolithography systems and materials will allow. However, as indicated in FIG. 1, the overall size of the feature, post-lithography, tends to be larger than its target dimensions, e.g., the post-lithography length 12PL and width 14PL are larger than the target length 12T and target width 14T, respectively. This is due to the limitations of traditional deep UV photolithography systems as it relates to trying to directly image smaller and smaller features. Additionally, as reflected in FIG. 1, due to so-called etch-bias, the post-etch feature tends to be smaller in physical size than the post-litho feature, i.e., the post-etch length 12PE and width 14PE are less than post-litho length 12PL and width 14PL, respectively.

The reduction in size of the features from the post-litho size to the post-etch size enables the desired reduction in feature size in terms of the width or critical dimension of the trench/hole type features which is necessary in manufacturing modern integrated circuit products. However, the magnitude of dimensional changes in the features is different in the length direction as compared to the width direction of the feature. More specifically, there is a length or tip etch bias 18 and a width or side etch bias 20. With continuing reference to FIG. 1, the tip-to-tip spacing for the target condition 16T, the post-litho condition 16PL and the post-etch condition 16PE are depicted. In general, as it relates to tip-to-tip spacing, the post-litho spacing 16PL is less than the target spacing 16T and the post-etch spacing 16PE is even less than the target spacing 16T. Similarly, post-litho width 14PL is greater than the target width 14T or the post-etch width 14PE. By way of example only, the post-litho spacing 16PL may be 50 nm, while the post-etch spacing 16PE may be 80 nm which equates to a tip etch bias 18 of 15 nm. Similarly, post-litho width 14PL may be about 40 nm, while the post-etch width 14PE may be about 20 nm, which equates to a side etch bias 20 of 10 nm. This overall change in the feature size from post-lithography to post-etch is sometimes referred to as "line-end-pull-back," which is typically described by a ratio between the tip etch bias 18 and the side etch bias 20. In the example described above, the line-end-pull-back would be about 1.5 (15/10). Similarly, the post-etch tip-to-side spacing 15PE is greater than the post-litho tip-to-side spacing 17PL due to this line-end-pull-back issue.

Importantly, as noted above, the tip etch bias 18 is greater than the side etch bias 20, which can have adverse effects on tip-to-tip and tip-to-side spacing between features because of the increased loss in the length direction when forming trench/hole type features as described above. FIG. 2 depicts situations wherein the above-described difference in etch bias may have adverse impacts as it relates to forming conductive lines and vias on integrated circuit products. FIG. 2 depicts three situations ("short," "target" and "open") for the connection between where conductive line features 30A, 30B are formed in a first layer of insulating material and a conductive line feature 32 formed in an overlying layer of insulating material. Ideally, in the target situation, the tip-to-tip spacing 30S between the conductive line features 30A, 30B will be large enough such that the overlying conductive line 32 will only be conductively coupled to the feature 30A and it will not be conductively coupled to the feature 30B. If the tip-to-tip spacing between the features 30A, 30B becomes smaller than the target spacing 30S, then a short circuit will occur as the features 30A, 30B will contact one another, as indicated at the arrow 34, and the line 32 is conductively coupled to the feature 30B. Conversely, if the tip-to-tip spacing becomes wider than the target spacing 30S, an open circuit will result as the line 32 is not conductively coupled to the feature 30A. Negative etch biasing also has the undesirable effect of creating trench/hole type features with inwardly sloped sidewalls, i.e., the width at the top of the trench/hole type feature is greater than width at the bottom of the trench/hole type feature. The key metric for tip-to-tip spacing for trench/hole type features is the critical dimension at the bottom of the opening (because it is the bottom of the feature that makes contact with an underlying feature in an underlying metallization layer), which becomes larger post-etch than it is post-litho. Thus, while use of negative etch bias etching processes can produce features having very small critical dimensions, e.g., very narrow metal lines, the reduction in feature size can undesirably increase spacing between adjacent structures, e.g., it can increase tip-to-tip and tip-to-side spacing, which may lead to some of the problems identified above. Ideally, the cross-sectional configuration of the trench/hole type feature would be approximately rectangular or square with substantially vertically oriented sidewalls.

The present disclosure is directed to various novel methods of forming trench/hole type features in a layer of material of an integrated circuit product that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming trench/hole type features in a layer of material of an integrated circuit product. One illustrative method disclosed herein involves forming a layer of insulating material, forming a patterned layer of photoresist above the layer of insulating material, wherein the patterned layer of photoresist has an opening defined therein, forming an internal spacer within the opening in the patterned layer of photoresist, wherein the spacer defines a reduced-size opening, performing an etching process through the reduced-size opening on the layer of insulating material to define a trench/hole type feature in the layer of insulating material, and forming a conductive structure in the trench/hole type feature in the layer of insulating material.

Another illustrative method disclosed herein involves forming a layer of photoresist above a layer of insulating material, exposing the layer of photoresist material, developing the exposed layer of photoresist material using a positive tone developer, wherein the patterned layer of photoresist has an opening defined therein, forming an internal spacer within the opening in the patterned layer of photoresist, wherein the spacer defines a reduced-size opening, performing a positive etch bias etching process through the reduced-size opening on the layer of insulating material to define a trench/hole type feature in the layer of insulating material, and forming a conductive structure in the trench/hole type feature in the layer of insulating material.

BRIEF DESCRIPTION OF THE DRAWINGS

The disclosure may be understood by reference to the following description taken in conjunction with the accompanying drawings, in which like reference numerals identify like elements, and in which.

Figure 1:
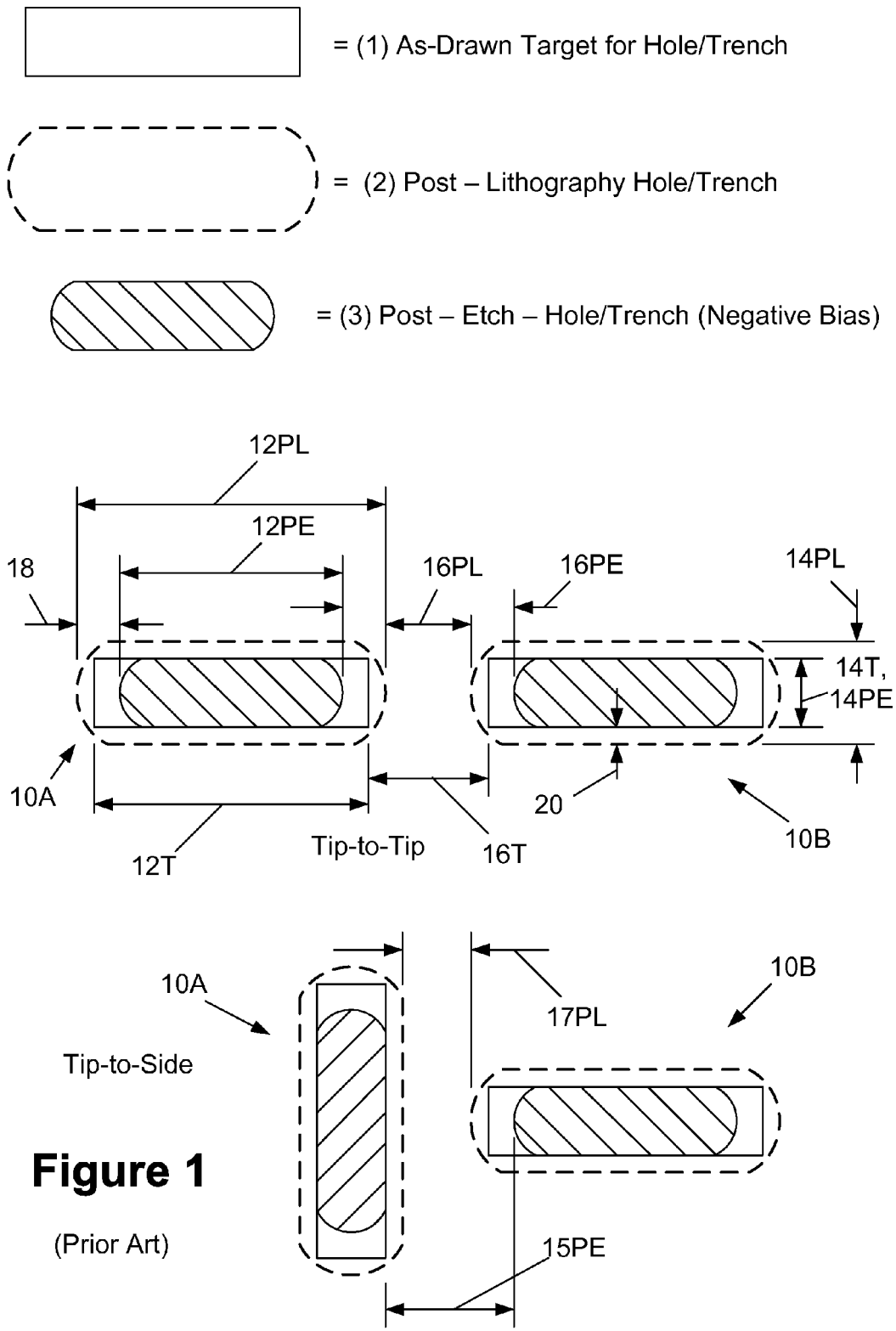
FIGS. 1-2 depict illustrative examples of prior art methods of forming trench/line type features and the resulting tip-to-tip and tip-to-edge spacing of such features.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various novel methods of forming trench/hole type features in a layer of material of an integrated circuit product. As will be readily apparent to those skilled in the art upon a complete reading of the present application, the methods disclosed herein may be employed in manufacturing a variety of different devices, including, but not limited to, logic devices, memory devices, etc., and they may be employed with respect to a variety of different technologies, e.g., N-type devices, P-type devices, CMOS applications, etc. With reference to the attached figures, various illustrative embodiments of the methods and devices disclosed herein will now be described in more detail.

Figure 2:
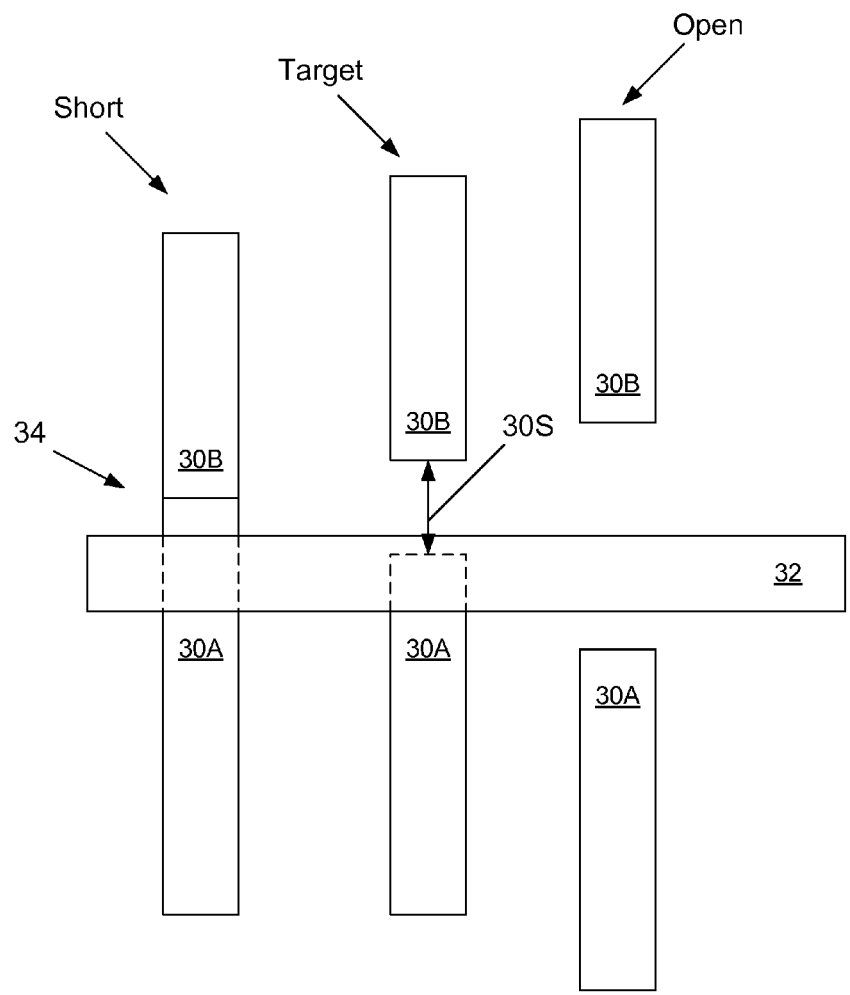
Figure 3A:
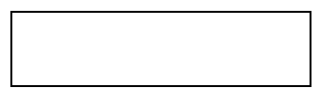
FIGS. 3A-3L depict illustrative methods disclosed herein for forming trench/hole type features in a layer of material of an integrated circuit product.
Figure 3A:
Figure 3A:
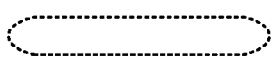
Figure 3A:

FIG. 3A is a drawing that, at a high level, depicts at least some aspects of the novel methods disclosed herein for forming trench/hole type features in a layer of material. In general, relative to the prior art techniques discussed in connection with FIGS. 1-2 above, the methods disclosed herein involve, after the patterned photoresist etch mask is formed, i.e., after the post-litho mask is formed, the processes disclosed herein involve performing one or both of a post-litho conformal shrink process and a positive bias etching process on the underlying layer of material to define the trench/hole type feature. Thus, the discussion below will make reference to several points in the process flow of forming a conductive line/via type feature in such a trench/hole type feature. More specifically, as shown in FIG. 3A, the following discussion will involve reference to: (1) the condition corresponding to the as-drawn target for the trench/hole type feature; (2) the post-lithography condition after a patterned photoresist mask has been formed based upon the as-drawn target; (3) the condition after the conformal shrink process has been performed on the post-lithography patterned photoresist mask; and (4) the post-etch condition using an illustrative positive etch bias etching process.

Some of the FIGS. 3B-3J contain a cross-sectional view and a plan view of a portion of an integrated circuit product wherein a conductive line will be formed so as to contact an illustrative conductive via in an underlying metallization layer. Cross-hatching has been added to both the plan and cross-sectional views in an attempt to aid understanding of the various inventions disclosed herein.

Figure 3B:
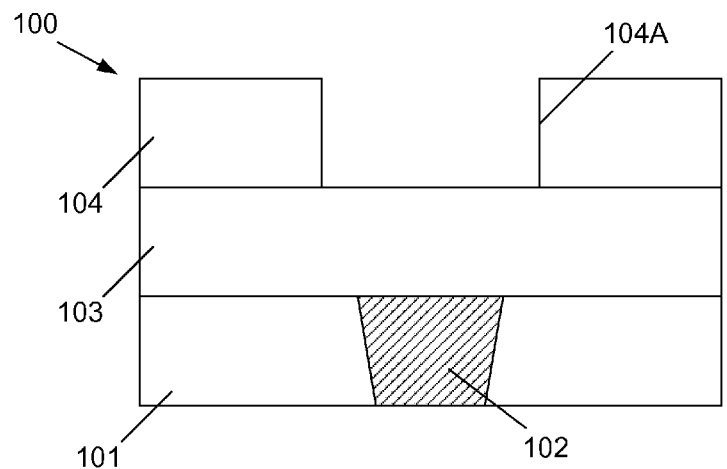
Figure 3B:
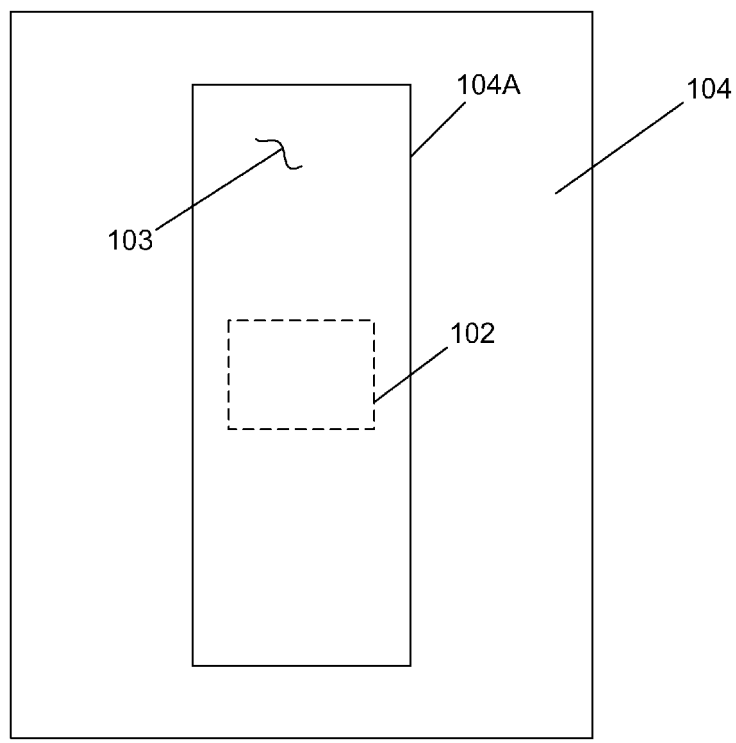

FIG. 3B is a simplified view of a portion of an illustrative integrated circuit product 100 at an intermediate stage of manufacturing that is formed above a semiconducting substrate (not shown). The product 100 may be any type of integrated circuit product that employs any type of integrated circuit and any of a variety of different shaped conductive structures, e.g., conductive lines and vias, that are formed in various metallization layers commonly found on integrated circuit products. At the point of fabrication depicted in FIG. 3B, a conductive feature 102 has been formed in a layer of insulating material 101, a second layer of insulating material 103 has been formed above the layer of insulating material 101, and a patterned layer of photoresist material 104, having a trench/line type opening 104A formed therein, has been formed above the layer of insulating material 103. As will be recognized by those skilled in the art after a complete reading of the present application, the inventions disclosed herein may be employed in forming trench/hole type features and corresponding conductive lines and vias having any desired shape, depth or configuration. Accordingly, the trench/hole type features and corresponding conductive lines and vias discussed herein are intended to be representative of any type of opening in any type of material wherein a conductive structure may be formed. In the depicted example, the conductive feature 102 is a substantially rectangular post-type conductive via.

The various components and structures of the product 100 may be initially formed using a variety of different materials and by performing a variety of known techniques. For example, the layers of insulating material 101, 103 may be comprised of any type of insulating material, e.g., silicon dioxide, a low-k insulating material (k value less than 3), a high-k material (k value greater than 10), etc., they may be formed to any desired thickness, and they may be formed by performing a variety of known techniques, for example, a chemical vapor deposition (CVD) process, an atomic layer deposition (ALD) process, plasma-enhanced versions of those processes, or a spin-on deposition (SOD) process, etc.

In one example, the layer of insulating material 101 was initially formed on an underlying structure (not shown), such as a semiconducting substrate or a previous metallization layer. Thereafter, the conductive feature 102 was formed in the layer of insulating material 101 by forming a patterned etch mask comprised of a photoresist material above the layer of insulating material 101, performing an etching process through the etch mask to define the trench/hole type feature in the layer of insulating material 101, removing the patterned etch mask, overfilling the trench/hole type feature in the layer of insulating material 101 with a conductive material, such as copper, and removing excess portions of the conductive material positioned outside of the trench/hole type feature by performing a chemical mechanical planarization (CMP) process. Next, the layer of insulating material 103 was deposited above the layer of insulating material 101 using traditional deposition techniques. Thereafter, the patterned layer of photoresist material 104 was formed above the layer of insulating material 103 using the photolithography processes described above. In one embodiment, the target dimensions (length and width) of the opening 104A may be at or near the limits of resolution of the photolithographic equipment, as was described in connection with the formation of trench/hole type features using the prior art methodologies discussed in the background section of this application. In other embodiments, the target dimensions for the opening 104A may be more "relaxed" and not at the capability limits of the photolithographic equipment and technology. Although the attached drawings are not to scale, in the depicted example, the opening 104A has a width that is larger than the width of the underlying conductive feature 102.

Figure 3C:
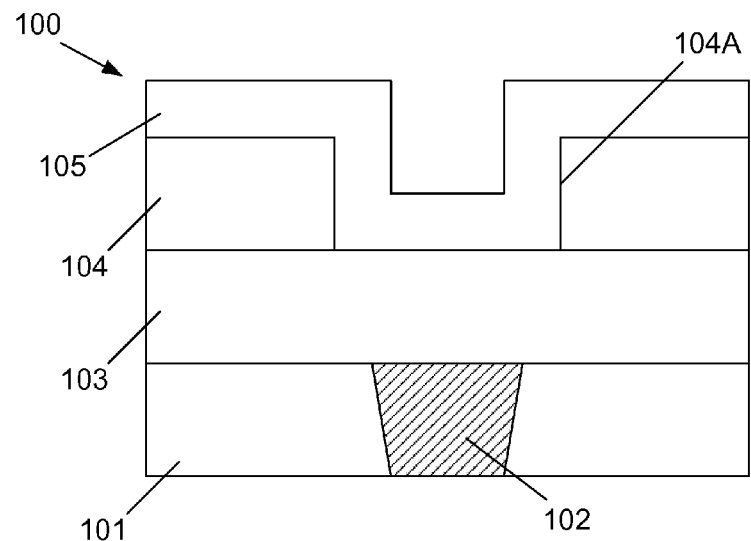
Figure 3C:
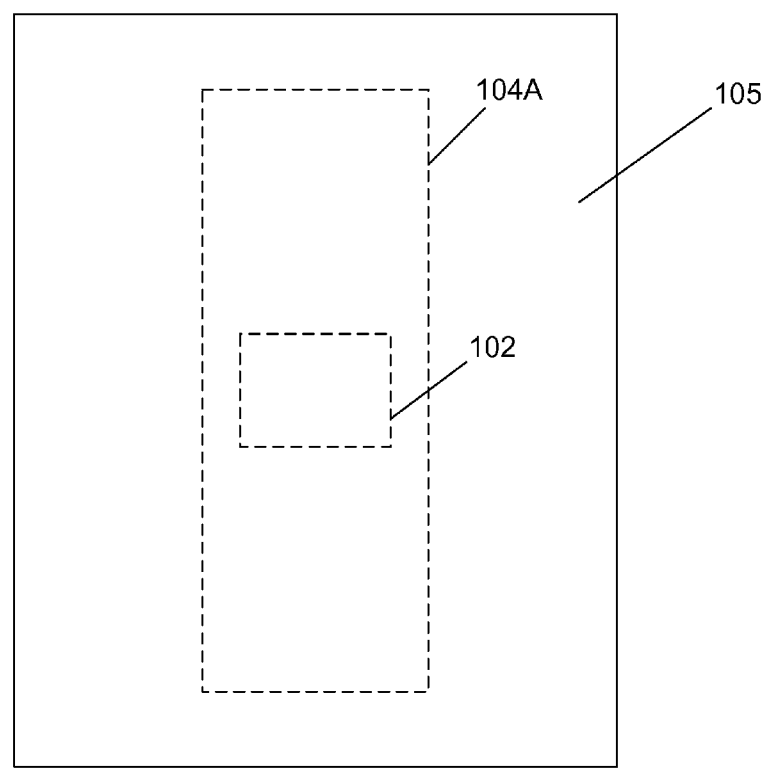

FIG. 3C depicts the product 100 after a layer of spacer material 105 has been deposited across the product and in the trench/hole type feature opening 104A using a conformal deposition process. The layer of spacer material 105 may be made of a variety of different materials, its thickness may vary depending upon the particular application and it may be initially deposited by a variety of techniques. For example, the layer of spacer material 105 may be comprised of any type of spacer material, silicon dioxide, carbon-containing materials, silicon nitride, amorphous carbon, a material that may be manufactured using a DSA process, etc., its thickness may fall within the range of about 1-50 nm (depending upon the application) and it may be formed by conformal processes such as ALD, CVD, DSA (directed self-assembly), etc.

Figure 3D:
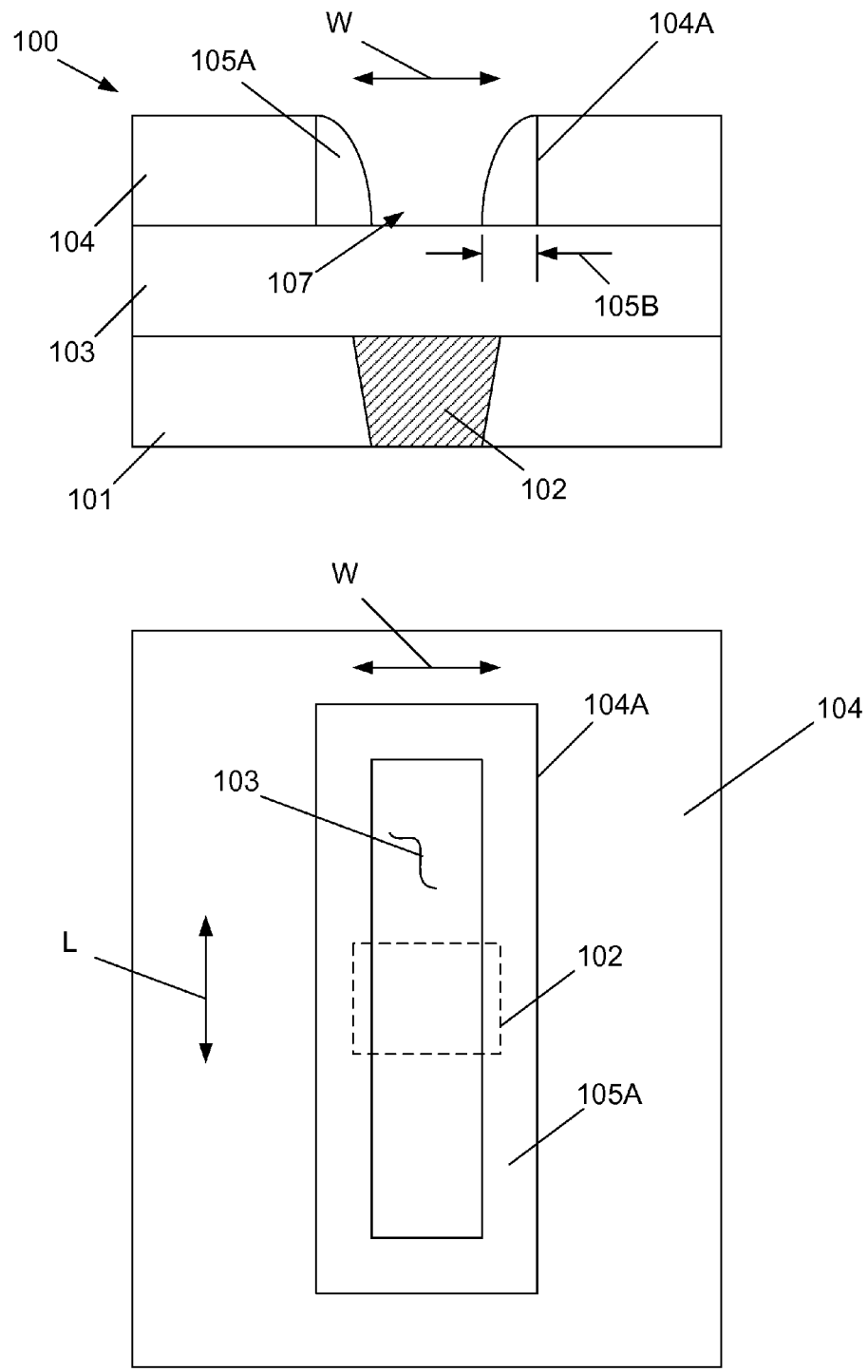
Figure 3E:
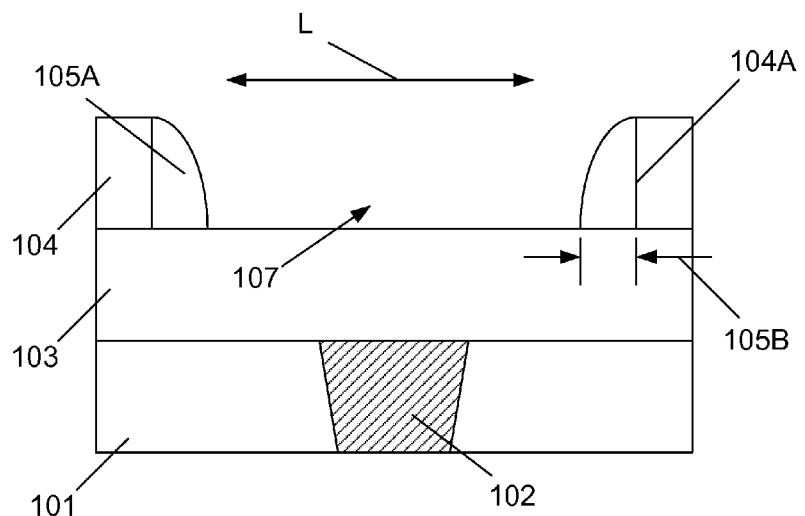

FIG. 3D depicts the product 100 after an anisotropic etching process has been performed on the layer of spacer material 105 to thereby define an internal spacer 105A within the opening 104A. The etch process selectively etches the layer of spacer material 105 relative to the layer of insulating material 103 and the patterned layer of photoresist material 104. The internal spacer 105A may have a thickness 105B at its base of about 1-50 nm, although the base thickness may vary depending upon the particular application. Importantly, the internal spacer 105A effectively shrinks the size of the original opening 104A uniformly in both the length (L) and width (W) directions due to the conformal nature of the layer of spacer material 105 and thereby defines a reduced size opening 107. FIG. 3E is a cross-sectional view of the structure shown in FIG. 3D taken in the length direction.

Figure 3G:
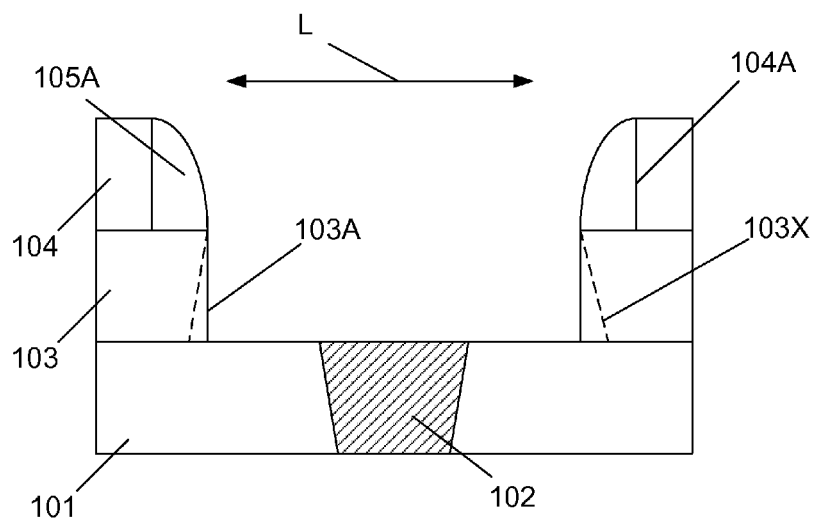
Figure 3F:
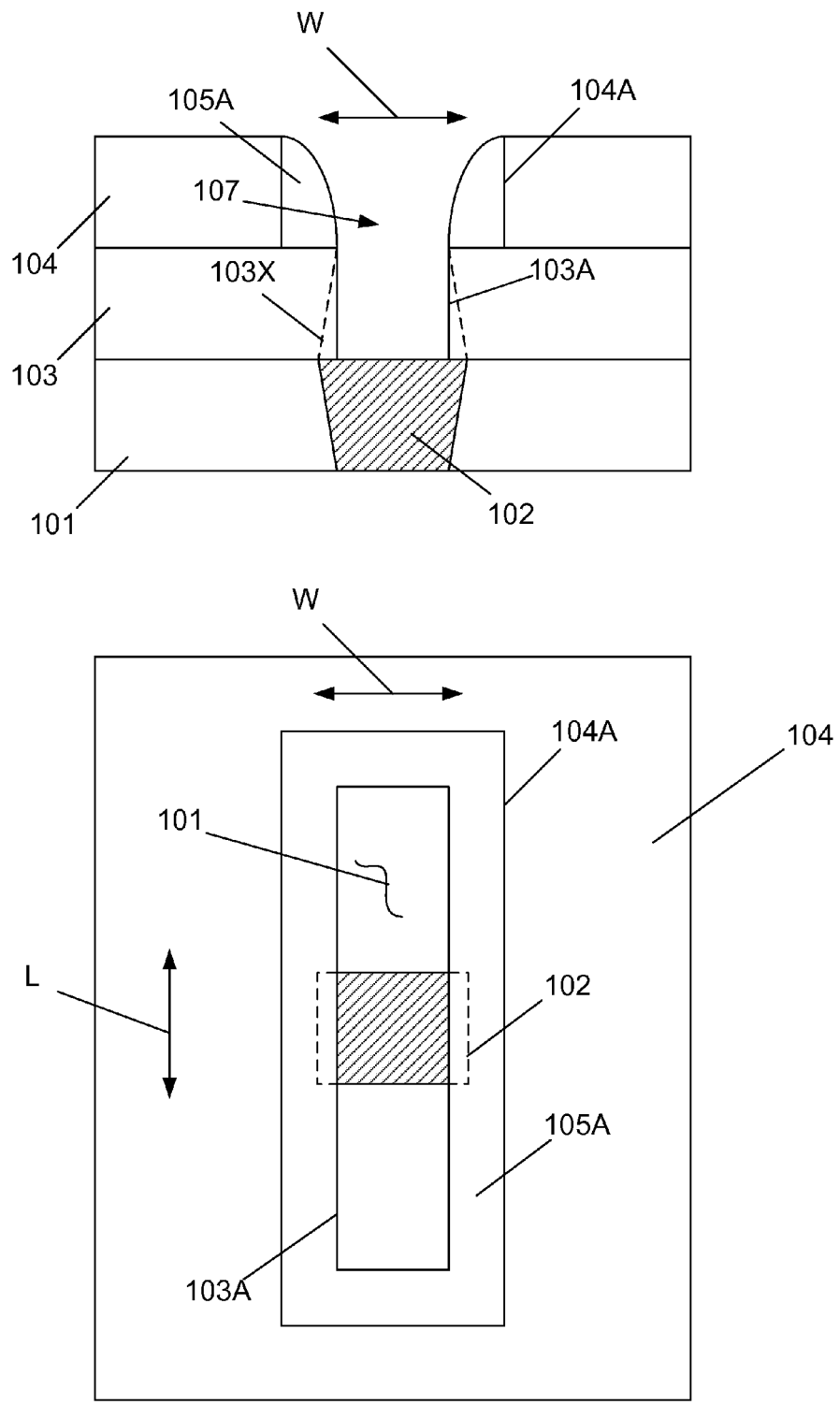

FIG. 3F depicts the product after an etching process has been performed through the reduced-size opening 107 now defined by the internal spacer 105A to define a trench/hole type feature 103A in the layer of insulating material 103. In one illustrative embodiment, the etching process may be a non-negative etch bias etching process, i.e., a positive etch bias or a substantially zero etch bias etching process, that results in the trench/hole type feature 103A having the depicted substantially vertical sidewalls (for a substantially zero etch bias process) or outwardly tapered sidewalls 103X (shown in dashed lines) for a positive etch bias etching process. FIG. 3G is a cross-sectional view of the structure shown in FIG. 3F taken in the length direction. As can be seen in FIG. 3G, by using a non-negative etch bias etching process to form the trench/hole type feature 103A, tip-to-tip spacing, side-to-side spacing and tip-to-side spacing that are all normally increased when performing a negative etch bias etching process, may be reduced or eliminated. In some cases, using a positive etch bias etching process to form the trench/hole type feature 103A may actually reduce tip-to-tip, side-to-side spacing and/or tip-to-side spacing during the etching process due to the formation of the outwardly tapered sidewalls 103X that are created when a positive etch bias etching process is used. However, in other embodiments, if desired, the etching process performed to define the trench/hole type feature 103A may be a negative etch bias process (as previously described) wherein the sidewalls of the trench/hole type feature 103A would be inwardly tapered, i.e., the width of the opening at the top of the feature 103A would be greater than the width of the opening at the bottom of the feature 103A.

Figure 3H:
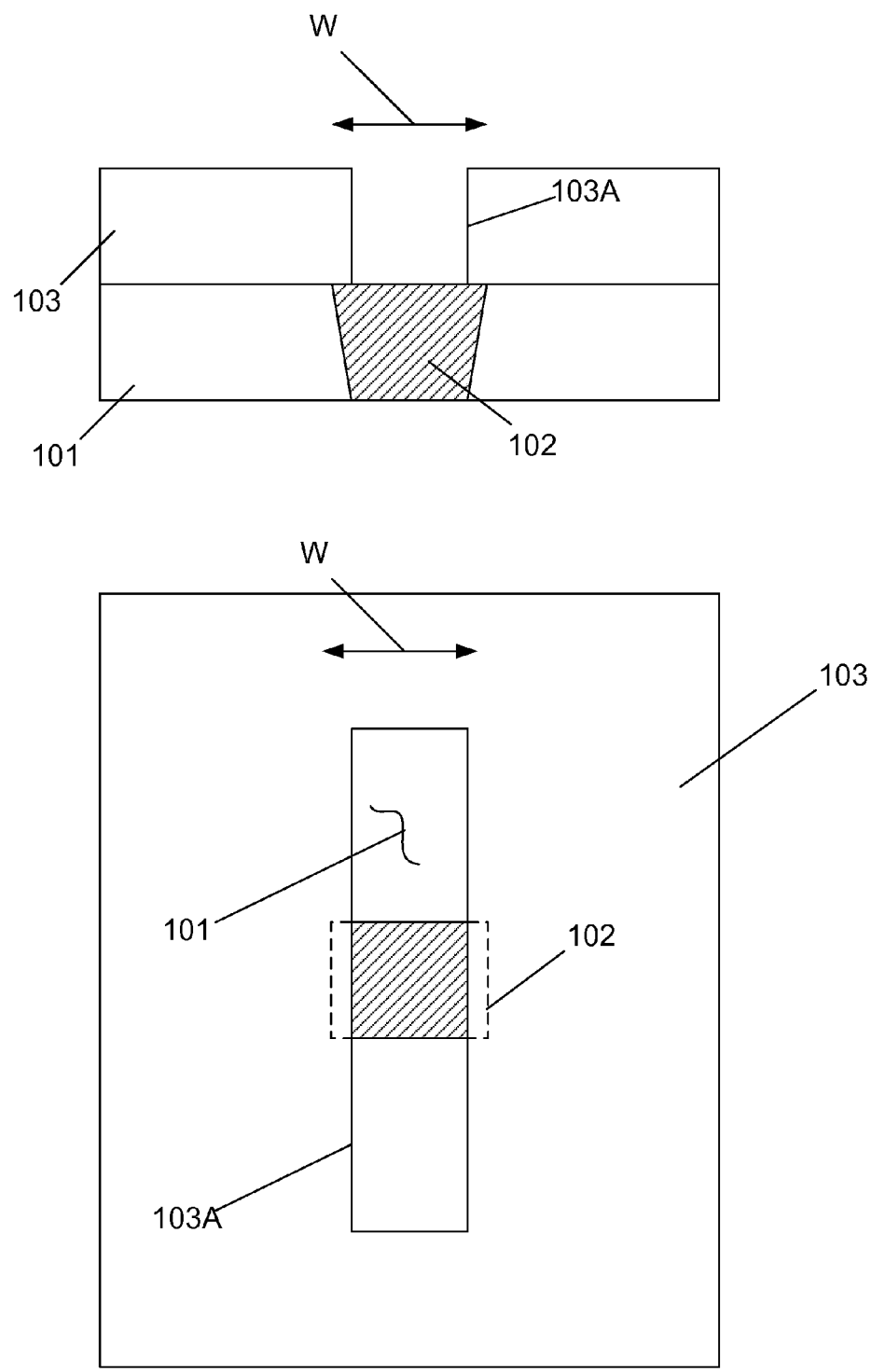

FIG. 3H depicts the product after the patterned layer of photoresist material 104 and the internal spacer 105A have been removed. These materials may be removed using a variety of known processes, e.g., plasma ashing, solvent rinse, etc.

Figure 3I:
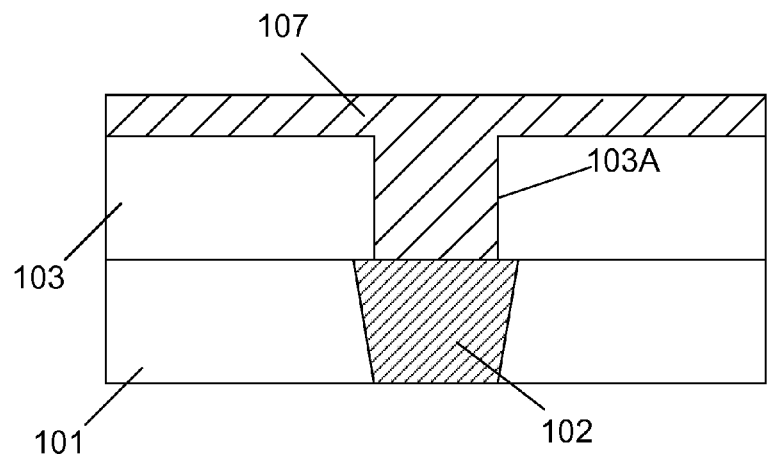
Figure 3I:
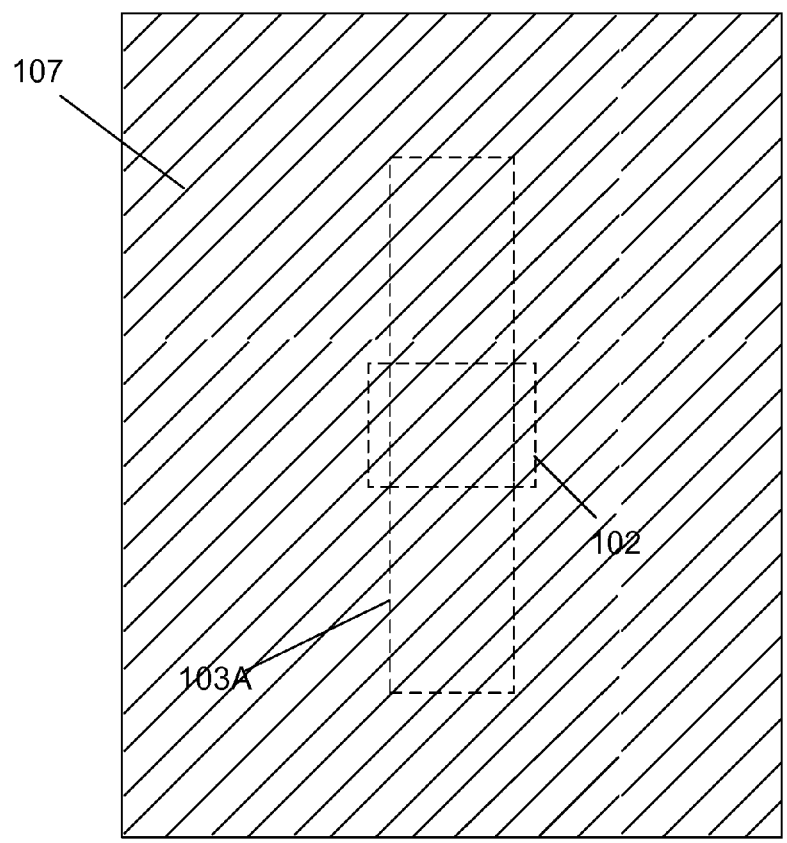

FIG. 3I depicts the product after a layer of conductive material 107 has been formed across the surface of the layer of insulating material 103 and overfills the opening 103A. So as not to obscure the presently disclosed inventions, any associated barrier layers, seed layers and the like that may be employed as part of the process of forming the layer of conductive material 107 are not depicted in the drawings. The layer of conductive material 107 is intended to be representative of any type of conductive material that may be employed in forming conductive structures on an integrated circuit product. In one example, the layer of conductive material may be a layer of copper, aluminum, tungsten, etc. The layer of conductive material 107 may be formed using any of a variety of known techniques, e.g., physical vapor deposition (PVD), electroplating, electroless plating, etc.

Figure 3J:
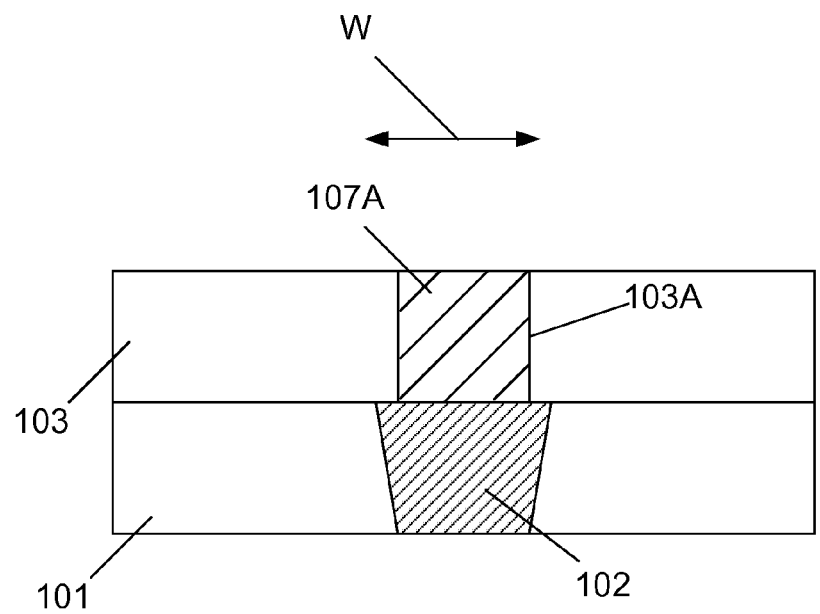
Figure 3J:
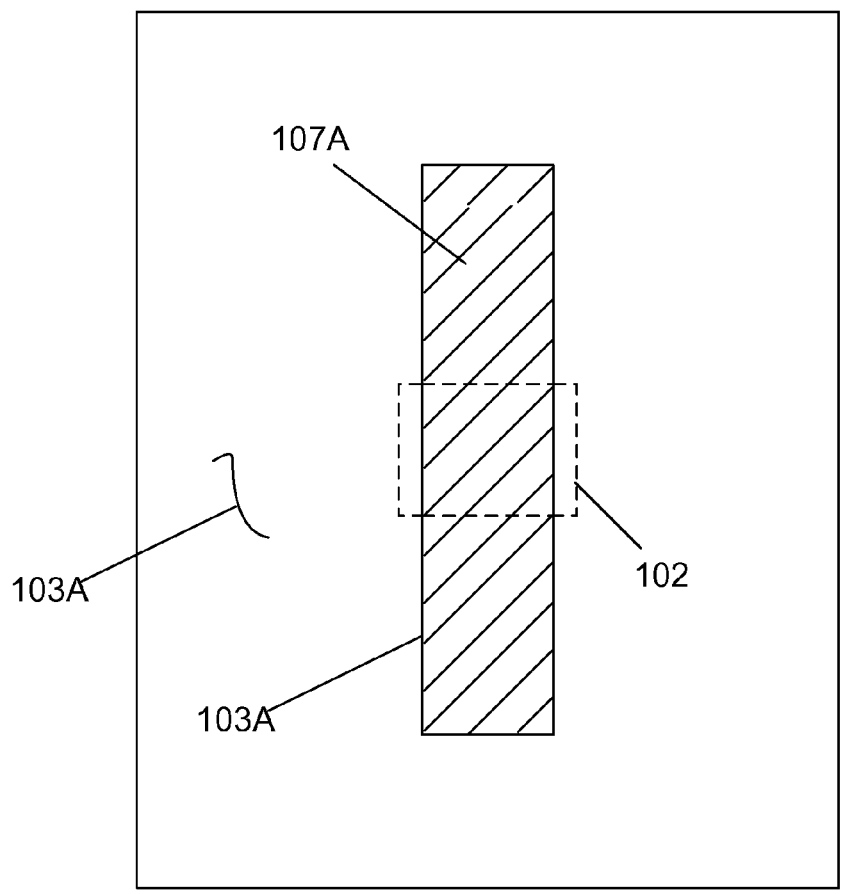

FIG. 3J depicts the product after a chemical mechanical polishing (CMP) process was performed to remove excess portions of the layer of conductive material 107 positioned outside of the trench/hole type feature 103A, which results in the conductive line-type feature 107A.

Figure 3K:
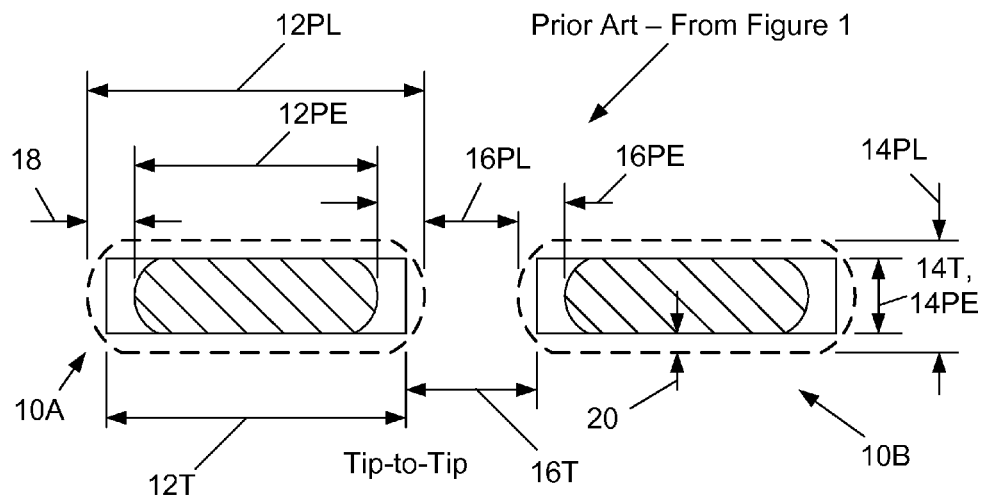
Figure 3K:
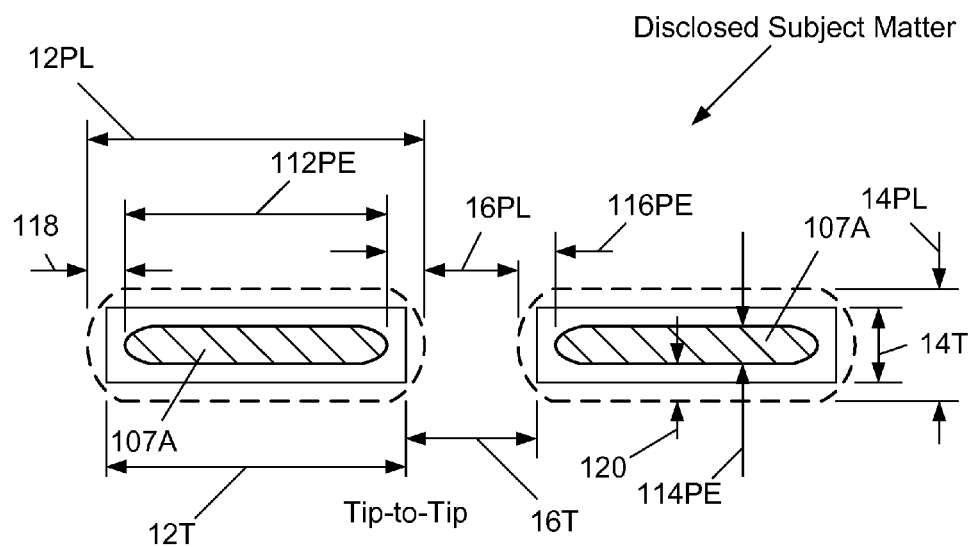

With reference to FIG. 3K, some of the benefits of the presently disclosed inventions relative to the prior art methods described in FIGS. 1-2 will now be discussed. In one embodiment, by forming the internal spacer 105A in the post-litho opening 104A and employing a non-negative etch bias etch process to define the trench/hole type feature 103A, the post-etch tip-to-tip spacing 116PE between adjacent conductive line/hole type structures, e.g., lines 107A, is less than the corresponding post-etch tip-to-tip spacing 16PE between adjacent features when using the prior art processes described above. For similar reasons, the post-etch length 112PE of the feature 107A is greater than the prior art post-etch length 12PE for the corresponding feature, and the post-etch width 114PE of the feature 107A is less than the post-etch width 14PE of the corresponding feature. Additionally, the post-etch tip-to-side spacing between conductive features, e.g., conductive lines 107A, is less than the prior art post-etch tip-to-side spacing 15PE (see FIG. 1), due to the reduction in the line-end-pull-back metric as a result of using the novel methods disclosed herein.

It is also worth noting that, unlike the prior art processes described above, utilizing the methods disclosed herein, the length or tip etch bias 118 and the width or side etch bias 120 are approximately the same due to the use of the internal spacer 105A to uniformly reduce the size of the opening 104A in the patterned layer of photoresist material 104. Thus, while the prior art processes exhibited a line-end-pull-back metric of about 1.5, the line-end-pull-back metric for the methodologies disclosed herein would be about 1. By reducing the line-end-pull-back metric, problems such as those described in FIG. 2 above may be reduced or avoided.

Figure 3L:
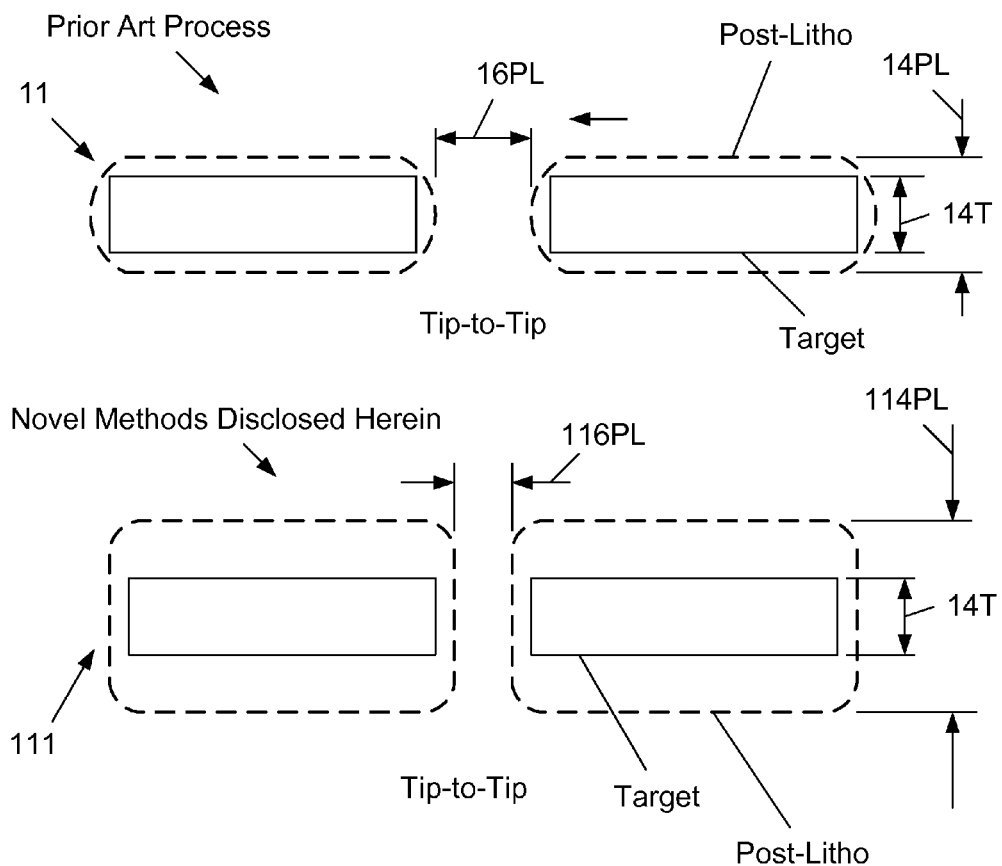

FIG. 3L is provided to describe another advantage the methods disclosed herein provide over the prior art methods described in the background section of this application. In one aspect, the prior art methodologies involved making the post-litho opening in the patterned layer of photoresist material as close as possible to the target dimension 14T of the feature and thereafter performing a negative etch bias etching process to etch the opening in the underlying layer of material. However, pushing the capability limitations of the photolithography tools to form the post-litho opening as close as possible to the final target dimensions resulted in openings in the patterned layer of photoresist material that exhibit sharp tip corner rounding, as indicated by the arrow 11 in FIG. 3L. In contrast, using the methods disclosed herein, the size of the post-litho opening 104A in the patterned layer of photoresist material 104 can be significantly larger than the target dimension 14T, since the size of the opening 104A will later be reduced by formation of the internal spacer 105A. As a result of not pushing the limits of the photolithography equipment, i.e., performing a more relaxed photolithography process, the post-litho opening 104A in the patterned layer of photoresist material 104 will exhibit a substantially flat-shaped tip, as indicated by the arrow 111, which leads to better tip-to-tip and tip-to-side control and better critical dimension uniformity. Additionally, using the prior art methodologies that produced post-litho openings with significant tip rounding, the post-litho spacing 16PL in the prior art processes tends to be larger than the post-litho spacing 116PL when the larger post-litho openings are employed as described herein. Accordingly, using the methods disclosed herein, the tip-to-tip and tip-toside spacing may be reduced relative to the prior art, thereby resulting in increased packing densities.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of fabricating a reduced-sized opening on a layer of an insulating material, the method comprising:
   forming a layer of insulating material;
   forming a patterned layer of photoresist above said layer of insulating material, said patterned layer of photoresist having an opening defined therein, wherein forming said patterned layer of photoresist comprises developing said layer of photoresist with a positive tone developer;
   forming an internal spacer within said opening in said patterned layer of photoresist, wherein said internal spacer defines a reduced-size opening;
   performing an etching process through said reduced-size opening on said layer of insulating material to define a trench/hole type feature in said layer of insulating material; and
   forming a conductive structure in said trench/hole type feature in said layer of insulating material.

2. The method of claim 1, wherein said layer of insulating material is comprised of one of silicon dioxide, a material having a k value less than 3 or a material having a k value greater than 10.

3. The method of claim 1, wherein said conductive structure is one of a conductive line or a conductive via.

4. The method of claim 1, wherein said conductive structure is comprised of one of copper, aluminum or tungsten.

5. The method of claim 1, wherein said trench/hole type feature has substantially vertically oriented sidewalls.

6. The method of claim 1, wherein said trench/hole type feature has outwardly tapered sidewalls.

7. The method of claim 1, wherein performing said etching process comprises performing a non-negative etch bias etching process.

8. The method of claim 1, wherein performing said etching process comprises performing a positive etch bias etching process.

9. The method of claim 1, wherein said internal spacer is comprised of one of silicon dioxide, a carbon-containing material or silicon nitride.

10. The method of claim 1, wherein forming said internal spacer comprises:
    performing a conformal deposition process to deposit a layer of material above said patterned layer of photoresist and in said opening in said patterned layer of photoresist; and
    performing an anisotropic etching process on said layer of material to thereby define said internal spacer.

11. A method of fabricating a reduced-sized opening on a layer of insulating material, the method comprising:
    forming a layer of insulating material;
    forming a layer of photoresist above said layer of insulating material;
    exposing said layer of photoresist material;
    developing said exposed layer of photoresist material using a positive tone developer, said layer of photoresist having an opening defined therein;
    forming an internal spacer within said opening in said layer of photoresist, wherein said internal spacer defines a reduced-size opening;
    performing a positive etch bias etching process through said reduced-size opening on said layer of insulating material to define a trench/hole type feature in said layer of insulating material, wherein said trench/hole type feature has outwardly tapered sidewalls; and
    forming a conductive structure in said trench/hole type feature in said layer of insulating material.

12. The method of claim 11, wherein said conductive structure is one of a conductive line or a conductive via.

13. The method of claim 11, wherein forming said internal spacer comprises:
    performing a conformal deposition process to deposit a layer of material above said layer of photoresist and in said opening in said layer of photoresist; and
    performing an anisotropic etching process on said layer of material to thereby define said internal spacer.

14. A method of fabricating a reduced-size opening on a layer of insulating material, the method comprising:
    forming a layer of insulating material;
    forming a layer of photoresist above said layer of insulating material;
    exposing said layer of photoresist material;
    developing said exposed layer of photoresist material using a positive tone developer, said layer of photoresist having an opening defined therein;
    forming an internal spacer within said opening in said layer of photoresist, wherein said internal spacer defines a reduced-size opening;
    performing an etching process with a substantially zero etch bias through said reduced-size opening on said layer of insulating material to define a trench/hole type feature in said layer of insulating material, wherein said trench/hole type feature has substantially vertically oriented sidewalls; and
    forming a conductive structure in said trench/hole type feature in said layer of insulating material.

15. The method of claim 14, wherein said layer of insulating material is comprised of one of silicon dioxide, a material having a k value less than 3 or a material having a k value greater than 10.

16. The method of claim 14, wherein said conductive structure is one of a conductive line or a conductive via.

17. The method of claim 14, wherein forming said internal spacer comprises:
    performing a conformal deposition process to deposit a layer of material above said layer of photoresist and in said opening in said layer of photoresist; and
    performing an anisotropic etching process on said layer of material to thereby define said internal spacer.

18. A method of fabricating a reduced-sized opening on a layer of an insulating material, the method comprising:
    forming a layer of insulating material;
    forming a patterned layer of photoresist above said layer of insulating material, said patterned layer of photoresist having an opening defined therein;
    forming an internal spacer within said opening in said patterned layer of photoresist, wherein said internal spacer defines a reduced-size opening, wherein forming the internal spacer comprises:

performing a conformal deposition process to deposit a layer of material above said patterned layer of photoresist and in said opening in said patterned layer of photoresist; and performing an anisotropic etching process on said layer of material to thereby define said internal spacer;

performing an etching process through said reduced-size opening on said layer of insulating material to define a trench/hole type feature in said layer of insulating material; and forming a conductive structure in said trench/hole type feature in said layer of insulating material.

19. The method of claim 18, wherein said layer of insulating material is comprised of one of silicon dioxide, a material having a k value less than 3 or a material having a k value greater than 10.

20. A method of fabricating a reduced-sized opening on a layer of an insulating material, the method comprising:

forming a layer of insulating material, wherein said layer of insulating material is comprised of one of silicon dioxide, a material having a k value less than 3 or a material having a k value greater than 10;

forming a patterned layer of photoresist above said layer of insulating material, said patterned layer of photoresist having an opening defined therein;

forming an internal spacer within said opening in said patterned layer of photoresist, wherein said internal spacer defines a reduced-size opening;

performing an etching process through said reduced-size opening on said layer of insulating material to define a trench/hole type feature in said layer of insulating material; and forming a conductive structure in said trench/hole type feature in said layer of insulating material.

* * * * *